United States Patent
Sun et al.

(10) Patent No.: US 9,778,333 B2
(45) Date of Patent: Oct. 3, 2017

(54) MAGNETIC RESONANCE (MR) IMAGING GENERATING PERFUSION IMAGES WITH ARTERIAL SPIN LABELING (ASL) AND 3D RADIAL PULSE SEQUENCES

(71) Applicant: GENERAL ELECTRIC COMPANY, Schenectady, NY (US)

(72) Inventors: Wei Sun, Waukesha, WI (US); Gaohong G. Wu, Waukesha, WI (US); Jason Andrew Polzin, Waukesha, WI (US); Ajit Shankaranarayanan, San Mateo, CA (US)

(73) Assignee: General Electric Company, Schenectady, NY (US)

( * ) Notice: Subject to any disclaimer, the term of this patent is extended or adjusted under 35 U.S.C. 154(b) by 1154 days.

(21) Appl. No.: 13/900,678

(22) Filed: May 23, 2013

(65) Prior Publication Data

US 2014/0347048 A1     Nov. 27, 2014

(51) Int. Cl.
*G01R 33/385* (2006.01)
*G01R 33/563* (2006.01)
*G01R 33/48* (2006.01)

(52) U.S. Cl.
CPC ..... *G01R 33/3854* (2013.01); *G01R 33/4826* (2013.01); *G01R 33/5635* (2013.01); *G01R 33/56366* (2013.01)

(58) Field of Classification Search
USPC .......... 324/300–322; 600/407–435; 382/128–131
See application file for complete search history.

(56) References Cited

U.S. PATENT DOCUMENTS

| 7,777,488 B2 * | 8/2010 | Gore ................. G01R 33/4824 324/307 |
| 8,121,668 B2 * | 2/2012 | Sutton ............... G01R 33/4806 600/407 |
| 8,260,396 B2 | 9/2012 | Guenther |
| 8,664,954 B2 * | 3/2014 | Hetzer ............... G01R 33/4818 324/309 |
| 9,360,539 B2 * | 6/2016 | Carroll ............... G01R 33/4826 |
| 2007/0096733 A1 | 5/2007 | Arunachalam et al. |

(Continued)

FOREIGN PATENT DOCUMENTS

JP     2013075198     4/2013

OTHER PUBLICATIONS

Silva, AfonsonC., "Ultra-Fast Magnetic Resonance Imaging Sequences," Brazilian Journal of Physics, vol. 25, No. 4, Dec. 1995.

(Continued)

*Primary Examiner* — Melissa Koval
*Assistant Examiner* — Tiffany Fetzner
(74) *Attorney, Agent, or Firm* — Dean D. Small; The Small Patent Law Group, LLC

(57) ABSTRACT

Systems and methods for reducing acoustic noise in a Magnetic Resonance Imaging (MRI) are provided. One method includes applying a labeling phase of an arterial spin labeling (ASL) pulse sequence to a region of interest, applying a three-dimensional (3D) radial pulse sequence to the region of interest to generate a tag image, applying a control phase of the ASL pulse sequence to the region of interest, and applying the 3D radial pulse sequence to the region of interest to generate a control image.

20 Claims, 8 Drawing Sheets

(56) References Cited

U.S. PATENT DOCUMENTS

| | | | |
|---|---|---|---|
| 2009/0021254 A1* | 1/2009 | Gore ................. | G01R 33/4824 324/309 |
| 2009/0088626 A1* | 4/2009 | Sutton ............... | G01R 33/4806 600/419 |
| 2010/0198053 A1 | 8/2010 | Miyazaki et al. | |
| 2012/0013336 A1* | 1/2012 | Hetzer .............. | G01R 33/4818 324/309 |
| 2012/0220858 A1 | 8/2012 | Carroll et al. | |
| 2012/0314909 A1 | 12/2012 | Edelman | |
| 2014/0347048 A1* | 11/2014 | Sun ................... | G01R 33/4826 324/306 |

OTHER PUBLICATIONS

Wu, Huimin, "Noncontrast-Enhanced Three-Dimensional (3D) Intracranial MR Angiography Using Pseudocontinuous Arterial Spin Labeling and Accelerated 3D Radial Acquisition," Magnetic Resonance in Medicine 000:000-000 (2012).

Helle, Michael, "Silent Pseudo-Continuous Arterial Spin Labeling," Phillips Research Laboratories, Hamberg Germany, Proc Intl. Soc. Mag. Reson. Med. 21 (2013) p. 2152.

Search Report and Written Opinion from corresponding PCT Application No. PCT/US2014/038787 dated Oct. 16, 2014; 9 pages.

* cited by examiner

ASL Inflow Imaging

Continues ASL

Pseudo Continues ASL

One segment of 3$^{rd}$ radial with RUFIS

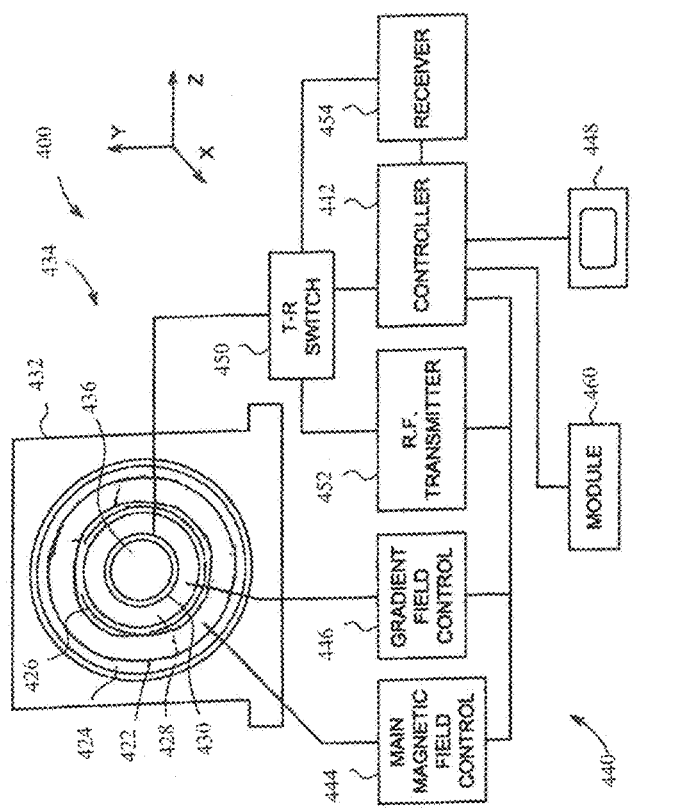

MAGNETIC RESONANCE (MR) IMAGING GENERATING PERFUSION IMAGES WITH ARTERIAL SPIN LABELING (ASL) AND 3D RADIAL PULSE SEQUENCES

BACKGROUND

The subject matter disclosed herein relates generally to Magnetic Resonance Imaging (MRI) systems, and more particularly to methods and systems for reducing acoustic noise in MRI systems.

MRI is a medical imaging modality that generates images of the inside of a human body without using x-rays or other ionizing radiation. MRI uses a main magnet to create a strong, uniform, static magnetic field (i.e., the "main magnetic field") and gradient coils to produce smaller amplitude, spatially varying magnetic fields when a current is applied to the gradient coils. When a human body, or part of a human body, is placed in the main magnetic field, the nuclear spins that are associated with hydrogen nuclei in tissue water become polarized. The magnetic moments that are associated with these spins become preferentially aligned along the direction of the main magnetic field, resulting in a small net tissue magnetization along that axis (the "z axis," by convention) and the gradient coils encode the MR signal.

At least some MRI systems generate a relatively high magnetic field strength using the main magnet. Additionally, the MRI system may be operated to perform relatively high-speed gradient coil current switching. In some cases, an interaction between the main magnetic field and the current switching in the gradient coils may generate vibrations in the gradient coil. As a result, the vibrations generated by the gradient coil, and potentially, a gradient coil support structure may create sound waves. High acoustic Sound Pressure Levels (SPLs) may be created in and/or around the MRI system due to these sound waves. Moreover, generating high-quality images by using relatively fast scan times may also generate acoustic noise of a substantially high level. The acoustic noise may therefore cause a decrease in patient comfort or an increase in patient anxiety during the image acquisition process.

BRIEF DESCRIPTION

In accordance with one embodiment, a method for reducing acoustic noise in a Magnetic Resonance Imaging (MRI) is provided. The method includes applying a labeling phase of an arterial spin labeling (ASL) pulse sequence to a region of interest, applying a three-dimensional (3D) radial pulse sequence to the region of interest to generate a tag image, applying a control phase of the ASL pulse sequence to the region of interest, and applying the 3D radial pulse sequence to the region of interest to generate a control image.

In another embodiment, a non-transitory computer readable storage medium for reducing acoustic noise in a magnetic resonance imaging (MRI) system using a processor is provided. The non-transitory computer readable storage medium including instructions to command the processor to apply a labeling phase of an arterial spin labeling (ASL) pulse sequence to a region of interest, apply a three-dimensional (3D) radial pulse sequence to the region of interest to generate a tag image, apply a control phase of the ASL pulse sequence to the region of interest, and apply the 3D radial pulse sequence to the region of interest to generate a control image.

In a further embodiment, a Magnetic Resonance Imaging (MRI) system is provided. The MRI system includes an imaging portion configured to apply a labeling phase of an arterial spin labeling (ASL) pulse sequence to a region of interest, apply a three-dimensional (3D) radial pulse sequence to the region of interest to generate a tag image, apply a control phase of the ASL pulse sequence to the region of interest, and apply the 3D radial pulse sequence to the region of interest to generate a control image. The MRI system also includes a processing portion configured to generate an inflow images (i.e. MR angiography or perfusion) using the tag image and the control image.

BRIEF DESCRIPTION OF THE DRAWINGS

FIG. 12 is a block diagram of an MRI system formed in accordance with various embodiments.

DETAILED DESCRIPTION

Figure 1:
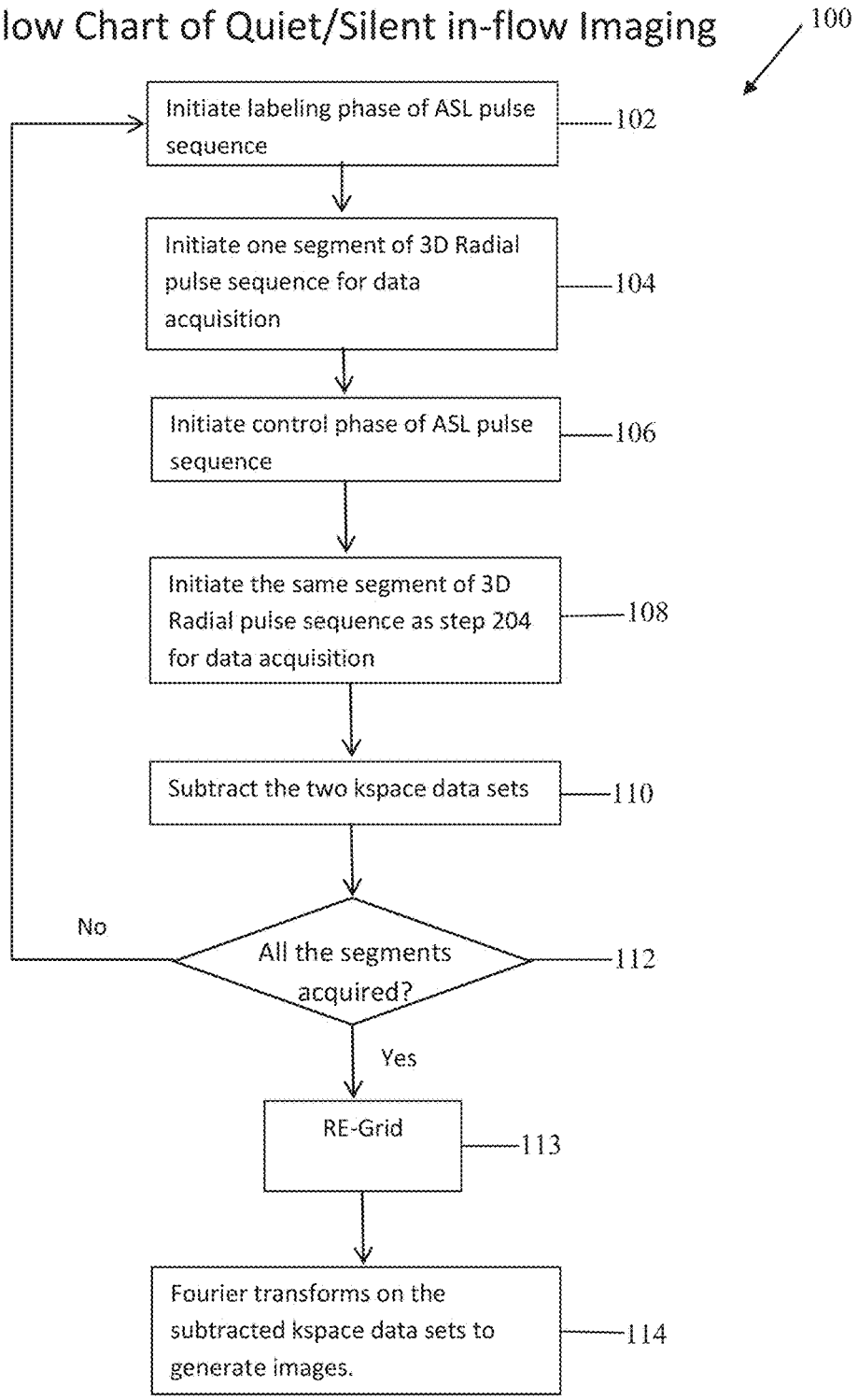
FIG. 1 is a flow chart illustrating an acoustic noise reduction method in accordance with various embodiments.

The following detailed description of certain embodiments will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings. Additionally, the system blocks in the various figures or the steps of the methods may be rearranged or reconfigured.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide methods and systems to reduce acoustic noise in a Magnetic Resonance Imaging (MRI) system. In some embodiments, a first segment or slice of a region of interest (ROI) is labeled using an arterial spin labeling (ASL) pulse sequence. K-space data of the first segment of a tag image is then acquired using a different pulse sequence, such as for example, a rotating ultra-fast imaging sequence (RUFIS). A control phase of the first segment is then labeled using the ASL pulse sequence. K-space data of the first segment of a control image is then acquired using the same RUFIS pulse sequence utilized to generate the K-space data of the tag image. The K-space data of the control image and the tag image are subtracted to generate the K-space data of the first segment of an inflow image (angiography or perfusion). The method described above is repeated until all segments K-space data are acquired in the ROI. An image reconstructure (i.e. regrid & Fourier transfer) is implemented on the subtracted K-space data to generate the final inflow image. Regrid, as used herein resamples the non-Cartesian MRI data into a Cartesian grid and applies an inverse Fast Fourier Transform (FFT). At least one technical effect of various embodiments is that the acoustic noise level observed during the MRI acquisition process is substantially reduced.

Figure 2:
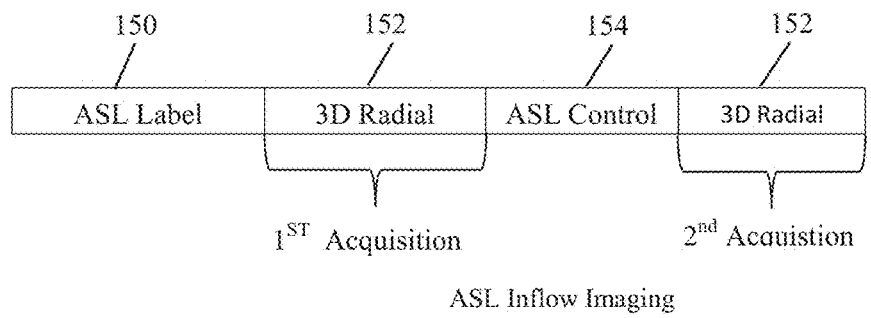
FIG. 2 is a diagram illustrating a plurality of pulse sequences in accordance with an embodiment.
Figure 3:
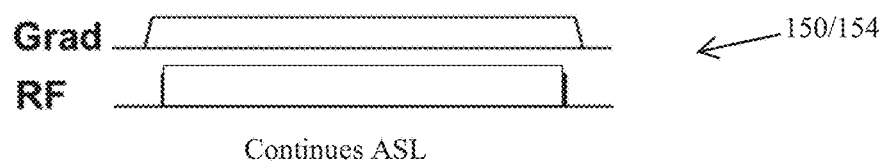
FIG. 3 is a diagram illustrating a pulse sequence in accordance with another embodiment.
Figure 4:
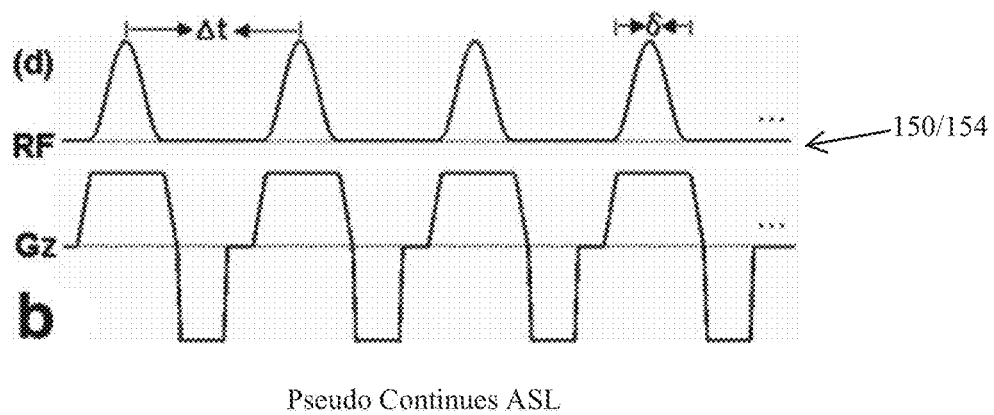
FIG. 4 is a diagram illustrating a plurality of pulse sequences in accordance with another embodiment.
Figure 5:
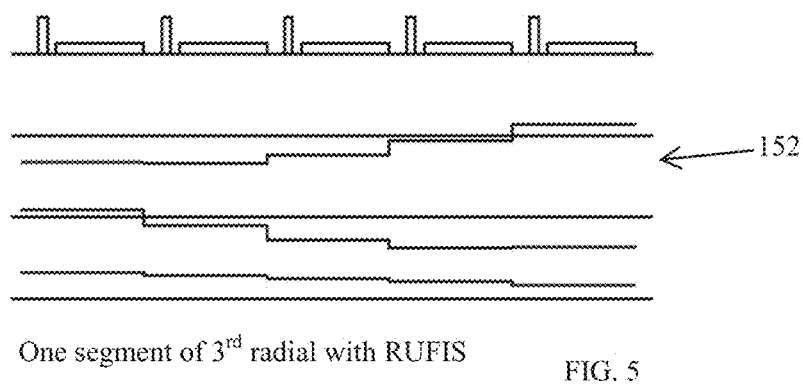
FIG. 5 is a diagram illustrating a plurality of pulse sequences in accordance with another embodiment.

FIG. 1 illustrates one embodiment of a MRI imaging process 100 that uses an arterial spin labeling (ASL) pulse sequence to label both a tag image and a control image. The embodiment, also utilizes a different pulse sequence, such as for example, a rotating ultra-fast imaging sequence (RUFIS) to acquire data for the tag image and the control image. FIG. 2 is a block diagram illustrating an exemplary ASL inflow imaging sequence. FIGS. 3 and 4 are graphical illustrations of an exemplary ASL pulse sequence 150/154 that may be utilized to perform the labeling described at 102/106. FIG. 5 illustrates an exemplary radial pulse sequence 152 that may be used for data acquisition and is described in more detail below. Additionally, FIG. 5 illustrates the outputs from an X-gradient coil (Gx), a Y-gradient coil (Gy), and a Z-gradient coil (Zy) all of which are described in more detail below.

Figure 6:
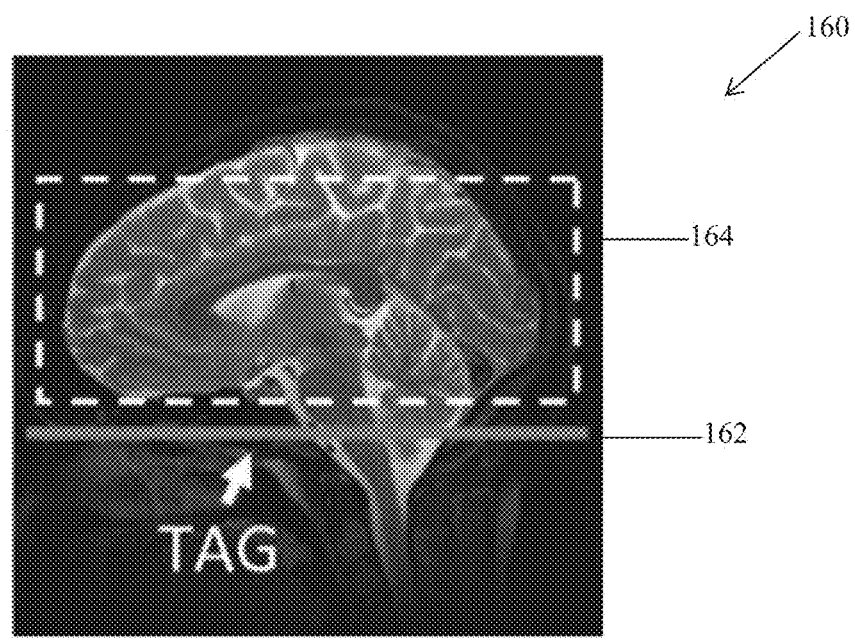
FIG. 6 is an image of an exemplary object of interest that may be generated in accordance with various embodiments.

Referring to FIG. 1, at 102 a labeling phase of an ASL pulse sequence is played or initiated. In various embodiments, the labeling phase of the ASL pulse sequence 150 is utilized to magnetically label an area adjacent to a desired tag image and/or a desired control image being generated. For example, FIG. 6 is side view of an exemplary object of interest 160 that may be imaged using various methods described herein. In the illustrated embodiment, the object of interest 160 is a patient's head. Therefore, in the illustrated embodiment, various methods described herein are utilized to image cerebral blood flow in the patient's head 160.

As described above, at 102 a labeling phase of the ASL pulse sequence 150 is initiated or played in an area that is adjacent to a region of interest image that is to be acquired. Initiated or played as used herein means that the RF coil is activated to generate the various pulse sequences described herein. For example, and as shown in FIG. 6, assume that it is desired to acquire a region of interest image 164. Initially, the labeling phase of the ASL pulse sequence 150 is utilized to magnetically label the arterial blood water in a region 162 that is adjacent to the desired image 164. In various embodiments, the ASL pulse sequence 150 is generated by applying one or a series of radio frequency (RF) pulses. In operation, the labeling phase of the ASL pulse sequence 150 inverts the net magnetization of the blood water in the region 162. More specifically, the ASL pulse sequence 150 magnetically labels the water molecules in the blood water within the region 162.

Figure 7:
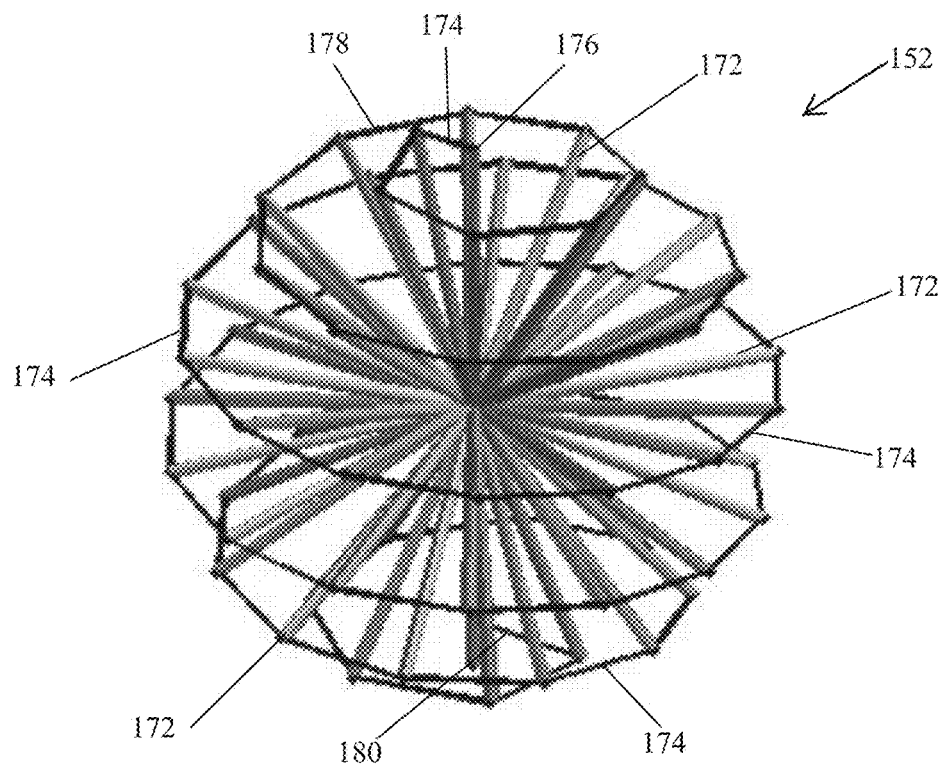
FIG. 7 is a diagram illustrating an exemplary pulse sequence in accordance with various embodiments.

Referring again to FIG. 1, at 104 a radial pulse sequence, such as the radial pulse sequence 152 (shown in FIG. 5) is initiated to acquire the data forming the region of interest image 164. In various embodiments, the radial pulse sequence 152 forms a portion of a rotating ultra-fast imaging sequence (RUFIS). In operation, RUFIS utilizes free-induction decay (FID) responses generated by a hard RF pulse. More specifically, RUFIS encodes the FIDs along different angular orientations in k-space. Thus, each FID corresponds to a single radial line in k-space along the gradient's direction. For example, FIG. 7 is a three-dimensional illustration of the exemplary RUFIS pulse sequence 152 shown in FIG. 5. In various embodiments, the RUFIS pulse sequence 152 includes a plurality of FIDs 172. More specifically, the RUFIS pulse sequence 152 is divided into a plurality of segments 174 wherein each of the segments 174 includes at least one FID 172.

In operation, the RUFIS pulse sequence 152 performs a radial center-outer data acquisition pattern. For example, and as shown in FIG. 7, a first segment 176 of data is acquired at a radially inner top portion, a second segment 178 of data is acquired at a position that is radially outer from the first segment 176, etc. Additionally, an nth segment 180 is acquired at a radially inner bottom portion. Thus, the RUFIS pulse sequence 152 acquires data initially at a top portion of the region of interest 164, spirals radially outwardly, and then spirals radially inwardly until the radially inner bottom portion of the nth data 180 is acquired.

In operation, the RUFIS pulse sequence 152 generates rapid succession low flip angle RF pulses. As a result, the duration of each RF pulse is sufficient to uniformly excite the region 164. Moreover, because each FID 172 is acquired for each corresponding RF pulse, and the gradient direction is rotated before the next FID 172 is acquired and before a subsequent RF pulse, the gradient fields generated, i.e. Gx, Gy, and Gz, are relatively small. Thus, no ramps in the gradient field are utilized as shown in FIG. 5.

Accordingly, and referring again to FIG. 1, at 104 the radial pulse sequence, such as the radial pulse sequence 152 (shown in FIG. 5) is initiated to acquire the data forming the region of interest image 164.

Figure 8:
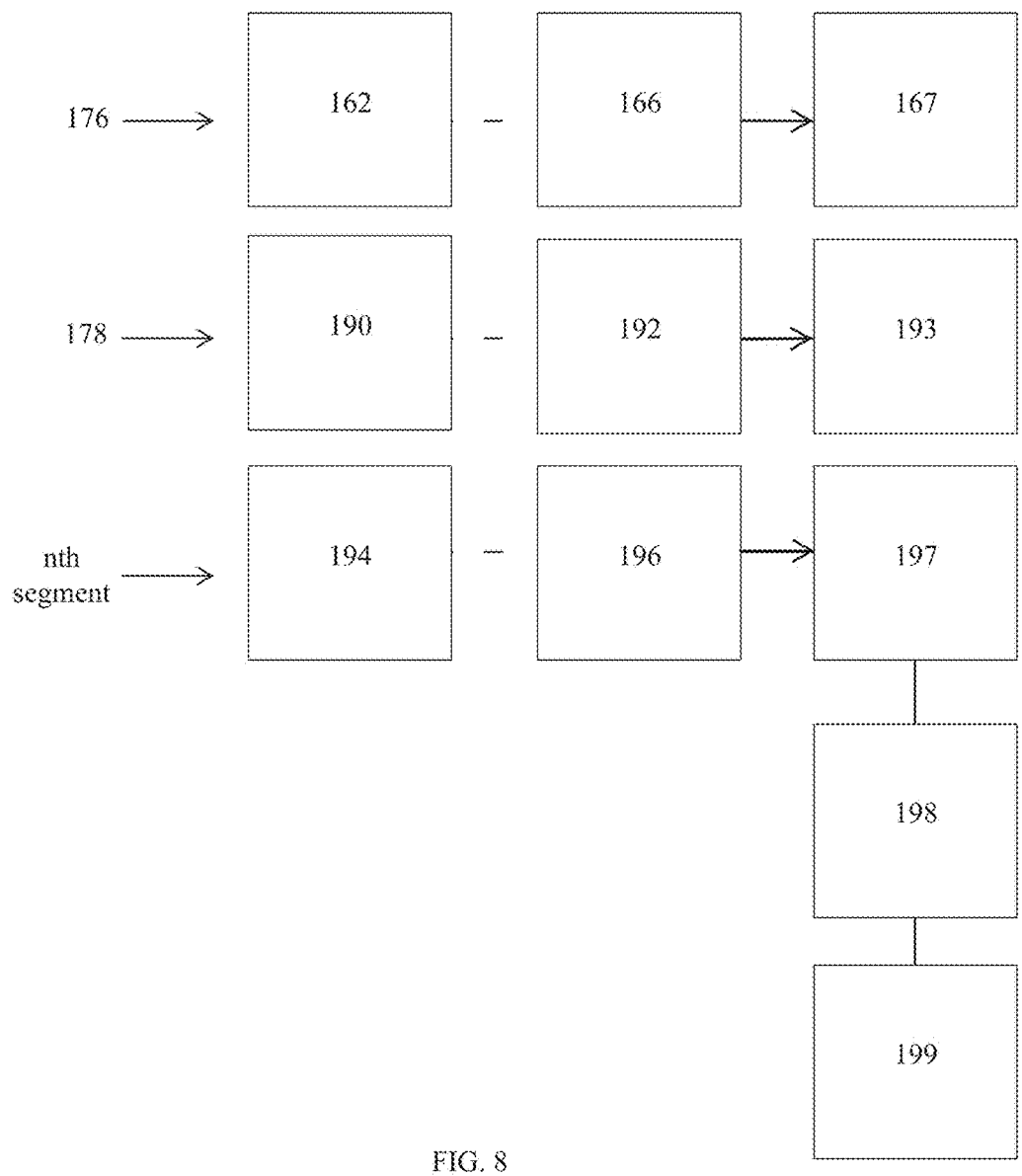
FIG. 8 is a block diagram of various data that may be generated in accordance with various embodiments.

At 106, a control phase of the ASL pulse sequence is initiated or played. The pulse sequence of the ASL control phase is similar to that of the ASL labeling phase (FIGS. 3 and 4) with some parameters modification. For example, the center frequency of the RF pulse or the amplitude of the gradient in FIG. 3 is typically modified so that the excitation plane is either moved on top of ROI 164 (CASL) or split to two planes (amCASL). For FIG. 4, the amplitude/phase of the RF pulses and the amplitude of the gradients are typically modified to avoid inverting the blood magnetization. In operation, the ASL control pulse sequence 154 does not invert the magnetization of the water molecules that was applied at 102. More specifically, the labeling phase of the ASL pulse sequence 150 is utilized to magnetically label an area adjacent to desired region of interest image being generated. Thus, the labeling phase of the ASL pulse sequence 150 is therefore utilized to magnetically label the arterial blood water in the region 162 that is adjacent to the desired region of interest image 164. After one segment of region of interest image 164 is acquired, the control phase of the ASL pulse sequence 154 is initiated. Then at 108, a radial pulse sequence, such as the radial pulse sequence 152 (shown in FIG. 5) is initiated to acquire the data forming a control image 166 (shown in FIG. 8).

In various embodiments, K-space data in the tag image and K-space data in the control image are acquired for each segment in the radial pulse sequence 152. As described above, the radial pulse sequence 152 includes a plurality of segments 174. Therefore, steps 102-108 are utilized for each of the segments 174. For example, and referring to FIG. 8, assume that the first segment 176 is selected. Then at 104 the tag image K-space data 162 of the first segment 176 is generated. Additionally, at 108 the control image K-space data 166 of the first segment 176 is generated. Then at 110, the subtracted k-space data 167 of the first segment 176 is generated. A tag image k-space data 190 and a control image k-space data 192 are then generated for the segment 178. More specifically, the tag image k-space data 190 of the segment 178 is generated at 104 and the control image k-space data 192 of the segment 178 is generated at 108. Then at 110, the subtracted k-space data 193 of the segment 178 is generated. In the exemplary embodiment, steps 102-108 are iteratively repeated for each of the n segments in the radial pulse sequence 152. Accordingly, a tag image k-space data 194 is generated for the nth segment and a control image k-space data 196 is also generated for the nth segment as described above. Additionally, a subtracted k-space dataset 197 is also generated for the nth segment.

In the exemplary embodiment, the ASL pulse sequence 150 and/or 154 may be implemented as described above. In various other embodiments, the ASL pulse sequence 150 and/or 154 may be implemented using a continuous ASL (CASL), a pulsed ASL (pASL), a pseudo continuous ASL with derating (pCASL), or an amplitude modulated ASL (amCASL).

In the exemplary embodiment, the 3D radial pulse sequence 152 may be implemented as described above. In various other embodiments, the 3D radial pulse sequence 152 may be implemented using 3D rotating ultra-fast imaging sequence (RUFIS) or 3D Sweep Imaging With Fourier Transformation (SWIFT).

In operation, the CASL inverts the blood flow continuously while the RF pulse is applied in the labeling phase. Moreover, the control phase of CASL is typically played on a different location (e.g. on top of ROI 164 in FIG. 6). Moreover, pASL is utilized to invert the arterial blood flow over a predetermined area. The RF pulse is then applied to a specific slice or segment. Moreover, (pCASL) utilizes a train of discrete RF pulses to mimic continuous tagging. Finally, amCASL applies a constant gradient pulse and a constant RF pulse during labeling. Whereas, during the control sequence, the gradient is maintained and the RF pulse is modulated with a sine wave frequency of $f_1$ which is equivalent to excitation at two different frequencies, $f_0-f_1$ and $f_0+f_1$, corresponding to two inversion planes.

It should be noted that the RUFIS pulse sequence 152 uses a 3D radial center-out k-space sampling with generally constant imaging gradients and no ramping, except for small incremental directional updates as shown in FIG. 5. More specifically, and as shown in FIG. 5, the gradient pulses Gx, Gy, and Gz are substantially constant with little or no ramping.

Referring again to FIG. 1, at 110 the two k-space datasets acquired at steps 104 and 108 are subtracted from each other to form a k-space dataset 167 of the segment 176, which is referred to herein a segment k-space dataset. For example, and referring again to FIG. 8, the control image dataset 166 acquired at 108 is subtracted from the tag image dataset 162 acquired at 104 to generate the segment k-space dataset 167.

Referring again to FIG. 2, at 112 the method determines if all k-space data in the tag image and the control image have been generated for each of the segments 174. In one embodiment, assume that a tag image and a control image have not been generated for the segment 178. Thus, the method 100 returns to step 102 to label the segment 178, the tag image 190 is generated at 104, control phase of the ASL pulse sequence is applied at 106, and the control image 192 is generated at 108. Then at 110, the control image 190 is subtracted from the tag image 192 to generate a segment k-space dataset 193 of the segment 178. It should be realized that while the terms tag image and control image are used herein, the tag image and the control image may be embodied as either 2D images, or k-space datasets. At 112, if the method determines that a tag image dataset and a control image dataset have been generated for each of the segments 174, the method proceeds to steps 113 and 114.

At 113 and 114, a regrid and Fourier transform is performed on the 3D k-space data acquired at 110. More specifically, all the acquired segment k-space datasets is combined into a 3D k-space dataset and is interpolated to a 3D Cartesian k-space. A Fourier transform is performed on the 3D Cartesian k-space to acquire that tag and control images. As will be appreciated by those skilled in the art, existing MR scanners are typically adapted, after data reconstruction, to provide 2-D k-space information. Using a separability property of the coordinates (e.g., X, Y and Z) in the discrete and/or fast Fourier transforms DFT/FFT, a collection of 2-D FFTs 198 (shown in FIG. 8) (2D k-spaces corresponding to 2-D slices of a volume) are generated so as to create a 3-D distribution. In various embodiments, this may be achieved by performing a 1-D DFT/FFT on the stack formed by 2-D slices, i.e. the slices 198, and combining those to form a 3-D k-space data distribution 199, also shown in FIG. 8. In other words, if A is a volume element formed by a stack of 2-D slices, then operating with a three-dimensional 3-D FFT/DFT on A is equivalent to performing a one dimensional FFT/DFT on B, where B is a stack of 2-D FFTs/DFTs of sequential slices of volume element A. The above procedure can simply be summarized by the following mathematical relation: 3-D FFT(A)=1-D FFT(B).

Once the 3-D k-space data 199 is obtained, as may be achieved using one or more of the above methods, the Fourier projection-slice theorem may be applied repeatedly to the 3-D k-space data along selected planes such that each plane is ultimately transformed into a 2-D X-ray like projection of the imaged volume, thereby offering multi-angle viewing of the imaged volume.

Figure 9:
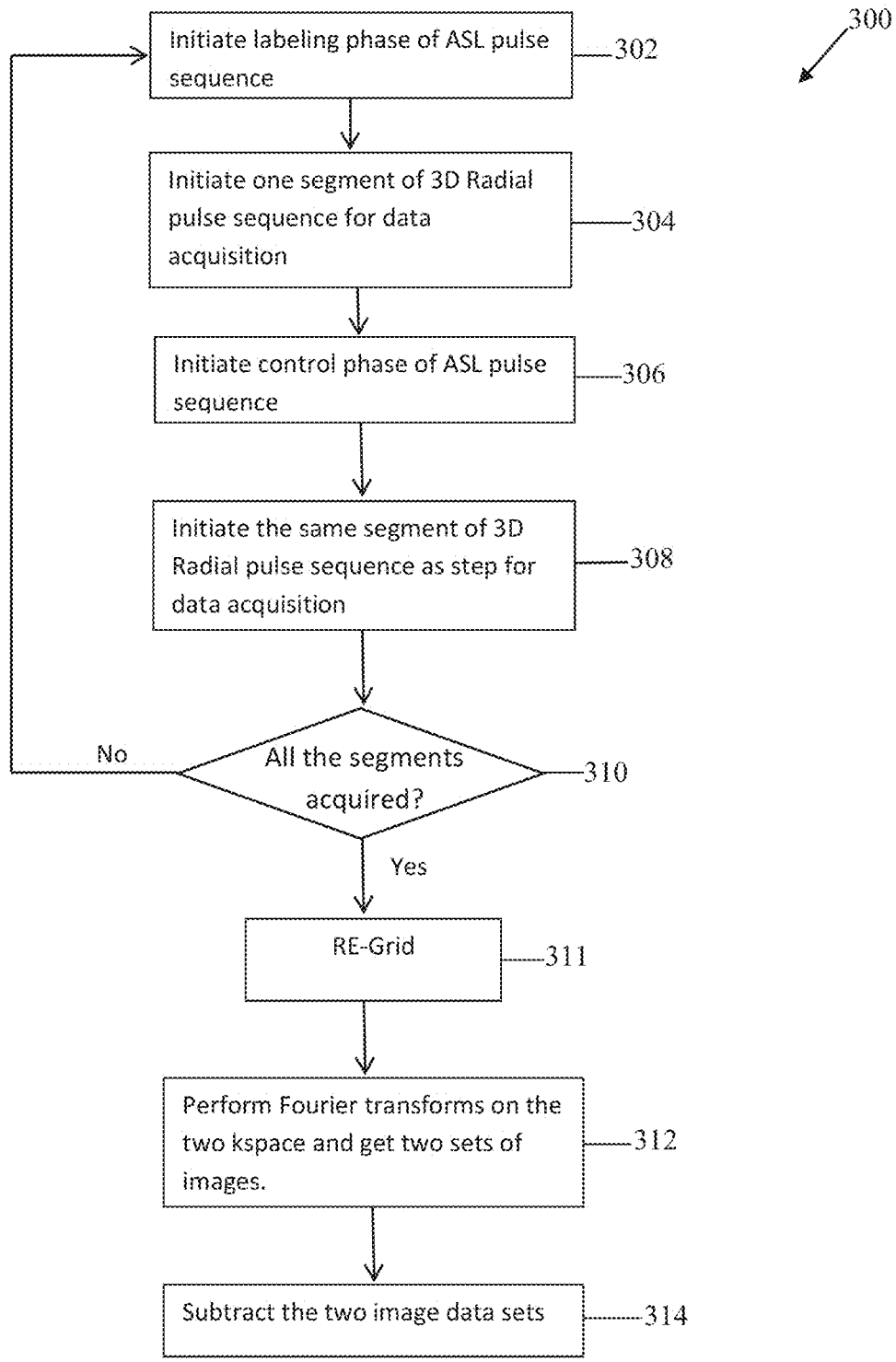
FIG. 9 is a flow chart illustrating another acoustic noise reduction method in accordance with various embodiments.

FIG. 9 is another embodiment of a MRI imaging process 300 that uses an arterial spin labeling (ASL) pulse sequence to label both a tag image and a control image. The embodiment of imaging process 300 also utilizes a different pulse sequence, such as for example, a rotating ultra-fast imaging sequence (RUFIS) to acquire data for the tag image and the control image.

Referring to FIG. 9, at 302 a labeling phase of an ASL pulse sequence is played or initiated. FIG. 2 is a graphical illustration of an exemplary ASL pulse sequence 150 that may be utilized to perform the labeling described at 302. FIG. 2 also illustrates an exemplary radial pulse sequence 152 that may be used for data acquisition and is described in more detail below.

Referring again to FIG. 9, at 304 a radial pulse sequence, such as the radial pulse sequence 152 (shown in FIG. 2) is initiated to acquire the data forming the tag image 162. In various embodiments, the radial pulse sequence 152 forms a portion of the RUFIS pulse sequence.

At 306, a control phase of the ASL pulse sequence is initiated or played. For example, as described above, FIG. 2 is a graphical illustration of an exemplary ASL control pulse sequence 154 that may be utilized to acquire the tag image. After the tag image 162 is acquired, the control phase of the ASL pulse sequence 154 is initiated. Then at 308, a radial pulse sequence, such as the radial pulse sequence 152 (shown in FIG. 2) is initiated to acquire the data forming a control image 166 (shown in FIG. 8).

In the exemplary embodiment, steps 302-308 are iteratively repeated for each of the n segments in the radial pulse sequence 152. Accordingly, a tag image 194 is generated for the nth segment and a control image 196 is also generated for the nth segment as described above. Additionally, a segment k-space dataset 197 is also generated for the nth segment.

At 310 the method determines if a tag image and a control image have been generated for each of the segments 174.

At 311 a regrid is performed on both k-space datasets, i.e. the k-space dataset for the tag image and the k-space dataset for the control image. At 312 a Fourier transform is performed on each of the acquired k-space datasets. For example, a Fourier transform is performed on the combined tagging image k-space dataset 162, 190 . . . 194. Additionally, a Fourier transform is performed on the combined control image k-space datasets 166, 192, . . . 196.

At 314, the tagging images and the control images acquired at 312 are subtracted from each other to generate the inflow images (MR angiography or perfusion).

Figure 10:
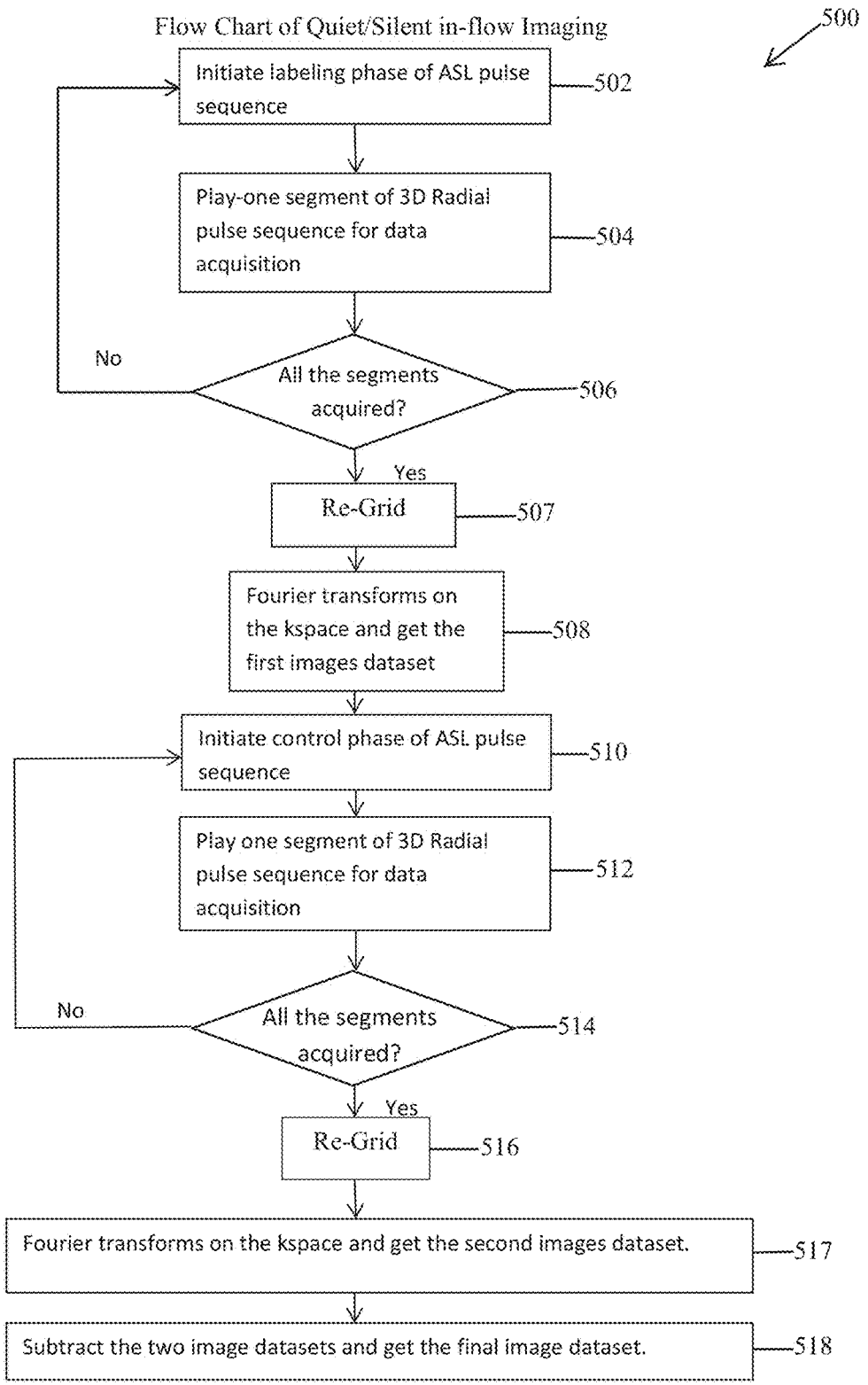
FIG. 10 is a flow chart illustrating another acoustic noise reduction method in accordance with various embodiments.

FIG. 10 is another embodiment of a MRI imaging process 500 that uses a combined arterial spin labeling (ASL) pulse sequence with a 3D radial pulse sequence for MR inflow imaging. Instead of acquiring one segment for the tagging images and the control images respectively as FIG. 9 shows, method 500 acquires all the segments for the tagging images first and then the control images.

Referring to FIG. 10, at 502 a labeling phase of an ASL pulse sequence is played or initiated. FIG. 2 is a graphical illustration of an exemplary ASL pulse sequence 150 that may be utilized to perform the labeling described at 502. FIG. 2 also illustrates an exemplary radial pulse sequence 152 that may be used for data acquisition and is described in more detail above.

At 504 a radial pulse sequence, such as the radial pulse sequence 152 (shown in FIG. 2) is initiated to acquire the data forming the tag image 162. In various embodiments, the radial pulse sequence 152 forms a portion of the RUFIS pulse sequence.

At 506 the method determines if all the k-space data for the tag image have been generated for each of the segments 174. More specifically, steps 502-504 are iteratively repeated for each of the n segments in the radial pulse sequence 152.

At 507, a regrid of the k-space data is performed and at 508 a Fourier transform is performed on the 3D k-space to generate tag images.

At 510, a control phase of the ASL pulse sequence is initiated or played. For example, as described above, FIG. 2 is a graphical illustration of an exemplary ASL control pulse sequence 154 that may be utilized to acquire the control image. After the tag image 162 is acquired, the control phase of the ASL pulse sequence 154 is initiated.

At 512, a radial pulse sequence, such as the radial pulse sequence 152 (shown in FIG. 2) is initiated to acquire the data forming the control image 166. In various embodiments, the radial pulse sequence 152 forms a portion of the RUFIS pulse sequence.

At 514, the 500 method determines if a control image has been generated for each of the segments 174. More specifically, steps 510-512 are iteratively repeated for each of the n segments in the radial pulse sequence 152.

At 516 and 517, regrid and Fourier transform are performed on the k-space data to generate the control images.

At 518, the tagging images acquired at 508 and the control images acquired at 516 are subtracted from each other to generate the MR inflow images.

Figure 11:
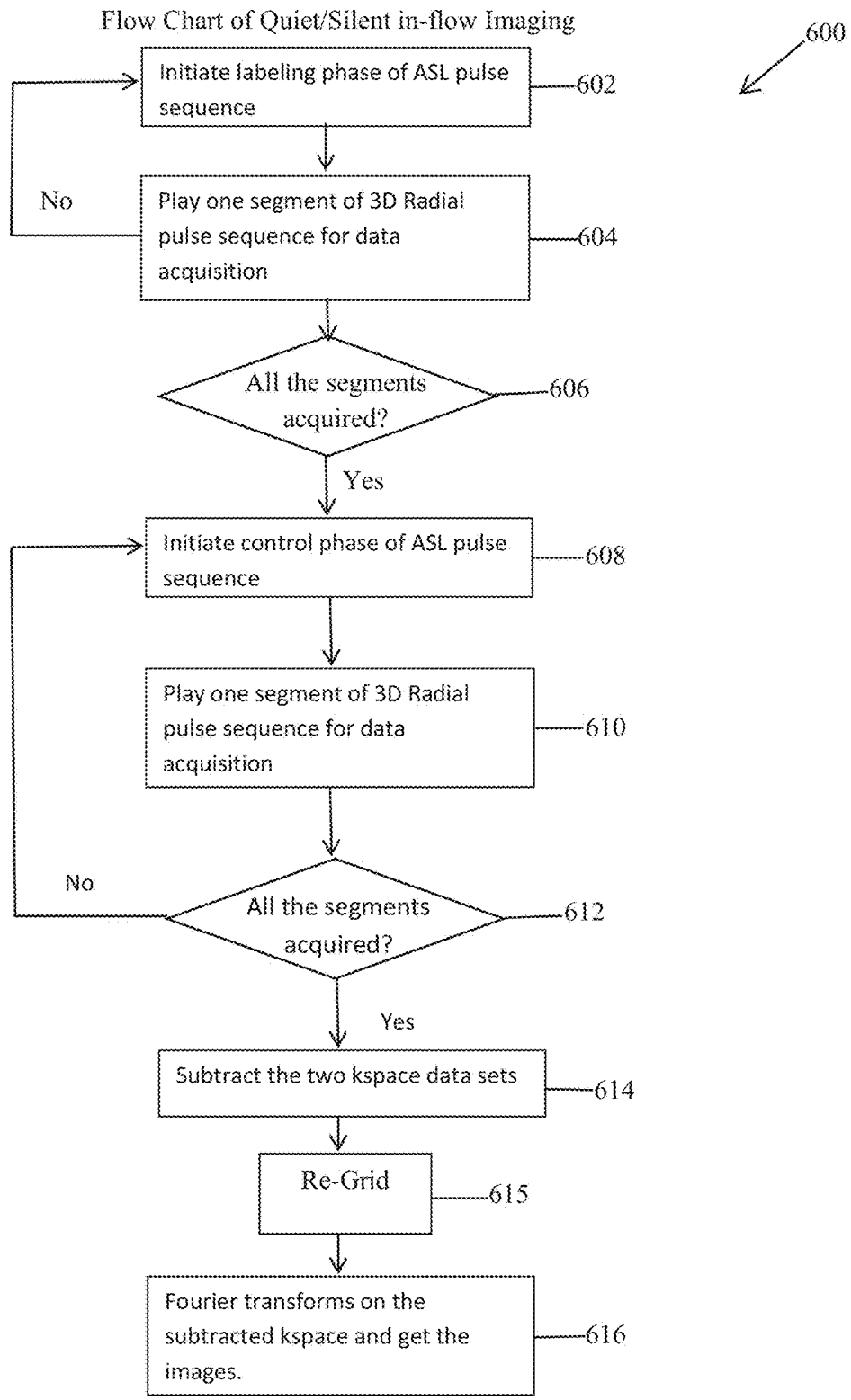
FIG. 11 is a flow chart illustrating another acoustic noise reduction method in accordance with various embodiments.

FIG. 11 is another embodiment of a MRI imaging process 600 that uses a combined arterial spin labeling (ASL) pulse sequence with a 3D radial pulse sequence for MR inflow imaging. Instead of reconstructing the images (508 and 516) and then subtracting them at 518 in the image space as shown in FIG. 10, the method 600 subtracts in the k-space at 614 first and then performs the regrid and Fourier transform at 615 and 616. Referring to FIG. 11, at 602 a labeling phase of an ASL pulse sequence is played or initiated. FIG. 2 is a graphical illustration of an exemplary ASL pulse sequence 150 that may be utilized to perform the labeling described at 602. FIG. 2 also illustrates an exemplary radial pulse sequence 152 that may be used for data acquisition and is described in more detail above.

At 604 a radial pulse sequence, such as the radial pulse sequence 152 (shown in FIG. 2) is initiated to acquire the data forming the tag image 162. In various embodiments, the radial pulse sequence 152 forms a portion of the RUFIS pulse sequence.

At 606 the method determines if all the k-space data for the tag image have been generated for each of the segments 174. More specifically, steps 602-604 are iteratively repeated for each of the n segments in the radial pulse sequence 152.

At 608, a control phase of the ASL pulse sequence is initiated or played. For example, as described above, FIG. 2 is a graphical illustration of an exemplary ASL control pulse sequence 154 that may be utilized to acquire the control image. After the tag image 162 is acquired, the control phase of the ASL pulse sequence 154 is initiated.

At 610, a radial pulse sequence, such as the radial pulse sequence 152 (shown in FIG. 2) is initiated to acquire the data forming the control image 162. In various embodiments, the radial pulse sequence 152 forms a portion of the RUFIS pulse sequence.

At 612, the 600 method determines if all the k-space data for the control image have been generated for each of the segments 174. More specifically, steps 608-610 are iteratively repeated for each of the n segments in the radial pulse sequence 152.

At 614, the two k-space datasets acquired at 602-612 are subtracted from each other to generate the k-space data for MR inflow images.

At 615 and 616, regrid and Fourier transform are performed on the 3D k-space to generate the MR inflow images.

Thus, various embodiments provide systems and methods allowing conductivity and permittivity mapping from a single 3D data set. Using ultra-short TE (which increases or maximizes SNR efficiency and decreases or minimizes unwanted phase changes due to chemical shift and $B_0$ inhomogeneities) and reduced or minimal gradient switching (to reduce eddy current induced phase changes), a 3D pulse sequence as described herein provides accurate mapping of TEP's.

It should be noted that the various embodiments described herein may be utilized to reduce the acoustic noise in an MRI system. Accordingly, although certain regions to be imaged are described herein, other regions may be imaged and the acoustic noise reduced in accordance with the various embodiments.

Accordingly, various embodiments provide non-invasive methods to reduce acoustic noise in an MRI system by utilizing an ASL pulse sequence and a RUFIS pulse sequence. The combination of the ASL pulse sequence and the RUFIS pulse sequence facilitate reducing gradient pulses that may result in generating the acoustic noise.

In various embodiments, the methods described herein may be implemented using, for example, an MRI system 400 as shown in FIG. 12. In the exemplary embodiment, the MRI system 400 includes a superconducting magnet 422 formed from magnetic coils that may be supported on a magnet coil support structure. However, in other embodiments, different types of magnets may be used, such as permanent magnets or electromagnets. A vessel 424 (also referred to as a cryostat) surrounds the superconducting magnet 422 and is filled with liquid helium to cool the coils of the superconducting magnet 422. A thermal insulation 426 is provided surrounding the outer surface of the vessel 424 and the inner surface of the superconducting magnet 422. A plurality of magnetic gradient coils 428 are provided within the superconducting magnet 422 and a transmitter, for example, an RF transmit coil 430 is provided within the plurality of magnetic gradient coils 428. In some embodiments the RF transmit coil 430 may be replaced with a transmit and receive coil defining a transmitter and receiver.

The components described above are located within a gantry 432 and generally form an imaging portion 434. It should be noted that although the superconducting magnet 422 is a cylindrical shaped, other shapes of magnets can be used.

A processing portion 440 generally includes a controller 442, a main magnetic field control 444, a gradient field control 446, a display device 448, a transmit-receive (T-R) switch 450, an RF transmitter 452 and a receiver 454. In the exemplary embodiment, a module 460 may be programmed to perform the various methods described herein. The module 460 may be implemented as a tangible non-transitory computer readable medium, is programmed to reduce the acoustic noise generated by the MRI system as described in more detail herein.

In operation, a patient is inserted into a bore 436 of the MRI system 400. The superconducting magnet 422 produces an approximately uniform and static main magnetic field $B_0$ across the bore 436. The strength of the electromagnetic field in the bore 436 and correspondingly in the patient, is controlled by the controller 442 via the main magnetic field control 444, which also controls a supply of energizing current to the superconducting magnet 422.

The magnetic gradient coils 428, which include one or more gradient coil elements, are provided so that a magnetic gradient can be imposed on the magnetic field $B_0$ in the bore 436 within the superconducting magnet 422 in any one or more of three orthogonal directions x, y, and z. The magnetic gradient coils 428 are energized by the gradient field control 446 and are also controlled by the controller 442, for example, as described herein.

The RF transmit coil 430, which may include a plurality of coils (e.g., resonant surface coils), is arranged to transmit magnetic pulses (for example, as described herein) and/or optionally simultaneously detect MR signals from the patient if receivers, such as receive coil elements are also provided, such as a surface coil (not shown) configured as an RF receive coil. The RF transmit coil 430 and the receive surface coil are selectably interconnected to one of the RF transmitter 452 or the receiver 454, respectively, by the T-R switch 450. The RF transmitter 452 and T-R switch 450 are controlled by the controller 442 such that RF field pulses or signals, i.e. the ASL pulse sequence and/or the RUFIS pulse sequence, are generated by the RF transmitter 452 and selectively applied to the patient for excitation of magnetic resonance in the patient.

Following application of the RF pulses, the T-R switch 450 is again actuated to decouple the RF transmit coil 430 from the RF transmitter 452. The detected MR signals are in turn communicated to the controller 442. The processed signals representative of an image are also transmitted to the display device 448 to provide a visual display of the image.

The various embodiments may be implemented in connection with different types of superconducting coils, such as superconducting coils for an MRI system. For example, the various embodiments may be implemented with superconducting coils for use with an MRI system 400 shown in FIG. 9. It should be appreciated that although the system 400 is illustrated as a single modality imaging system, the various embodiments may be implemented in or with multi-modality imaging systems. The system 400 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), field-programmable gate arrays (FPGAs), graphical processing units (GPUs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, the embodiments are by no means limiting and are exemplary embodiments. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A method of generating a plurality of perfusion images, of a region of interest that are generated from k-space datasets in a magnetic resonance imaging (MRI) system, said method comprising:

activating a radio frequency (RF) coil of the MRI system in order to apply a labeling phase of an arterial spin labeling (ASL) pulse sequence to a region of interest;

generating a tag image of the region of interest with one or more processors of the MRI system, by applying a three-dimensional (3D) radial pulse sequence from the activated RF coil of the MRI system onto the region of interest;

activating the RF coil of the MRI system in order to apply a control phase of the ASL pulse sequence onto the region of interest, wherein the applied control phase modifies a frequency, a phase, or an amplitude of the ASL pulse sequence;

generating a control image of the region of interest with the one or more processor of the MRI system, by applying the 3D radial pulse sequence from the activated RF coil onto the region of interest;

using the one or more processors of the MRI system in order to subtract the generated control image from the generated tag image and in order to generate k-space datasets; and using the one or more processors of the MRI system and the generated k-space data sets in order to generate a plurality of perfusion images of the region of interest.

2. The method of claim 1, wherein the 3D radial pulse sequence that is applied is configured to encode free-inductance decay responses along different angular orientations in k-spaces, such that the 3D radial pulse sequence acquires k-space data spiraling radially outward at a top portion of the region of interest and then spiraling radially inward until the radially inner bottom portion of the region of interest is acquired.

3. The method of claim 1, wherein the 3D radial pulse sequence includes a plurality of segments, and wherein the tag image and the control image are generated from the plurality of segments of the 3D radial pulse sequence.

4. The method of claim 3, wherein the subtracting operation includes subtracting the control image from the tag image, for each segment within the plurality of segments, in order to generate the k-space datasets for each segment.

5. The method of claim 1, further comprising:

applying an interpolation onto the generated k-space datasets with the one or more processors in order to generate a 3D Cartesian k-space dataset; and Fourier transforming the generated 3D Cartesian k-space dataset, with the one or more processors in order to generate the plurality of perfusion images.

6. The method of claim 1, wherein the region of interest is an arterial blood flow region, and the plurality of perfusion images include a plurality of inflow perfusion images or inflow angiography images.

7. The method of claim 1, wherein the ASL pulse sequence generated by the RF coil includes a continuous ASL (CASL), a pulsed ASL (pASL), a pseudo continuous ASL with deteriorating (pCASL), or an amplitude modulated ASL (amCASL).

8. A non-transitory computer readable storage medium that is usable with a magnetic resonance imaging (MRI) system having one or more processors that generates k-space datasets and a plurality of perfusion images of a region of interest using the generated k-space datasets the non-transitory computer readable storage medium including instructions to command the one or more processors to:

activate a radio frequency (RF) coil in order to apply a labeling phase of an arterial spin labeling (ASL) pulse sequence to a region of interest;

generate a tag image of the region of interest with one or more processors of the MRI system, by applying a three-dimensional (3D) radial pulse sequence from the activated RF coil of the MRI system onto the region of interest;
activate the RF coil of the MRI system in order to apply a control phase of the ASL pulse sequence onto the region of interest, wherein the applied control phase modifies a frequency, a phase, or an amplitude of the ASL pulse sequence;
generate a control image of the region of interest with the one or more processors of the MRI system, by applying the 3D radial pulse sequence to the region of interest; with the activated RF coil;
subtract the generated control image from the generated tag image in order to generate k-space datasets by using the one or more computer processors of the MRI system; and
generate a plurality of perfusion images of the region of interest from the generated k-space datasets with the one or more computer processors of the MRI system.

9. The non-transitory computer readable storage medium of claim 8, wherein the 3D radial pulse sequence that is applied is configured to encode free-inductance decay responses along different angular orientations in k-spaces, such that the 3D radial pulse sequence acquires k-space data spiraling radially outward at a top portion of the region of interest and then spiraling radially inward until the radially inner bottom portion of the region of interest is acquired.

10. The non-transitory computer readable storage medium of claim 8, wherein the 3D radial pulse sequence includes a plurality of segments, and wherein the tag image and the control image are generated from the plurality of segments of the 3D radial pulse sequence.

11. The non-transitory computer readable storage medium of claim 10, wherein the instructions command the processor to subtract the control image from the tag image, for each segment within the plurality of segments, in order to generate the k-space datasets for each segment.

12. The non-transitory computer readable storage medium of claim 8, wherein the instructions command the processor to:
apply an interpolation on the k-space datasets with the one or more processors in order to generate a 3D Cartesian k-space dataset; and
Fourier transforming the generated 3D Cartesian k-space dataset, with the one or more processors in order to generate the plurality of perfusion images;
wherein at least one of the one or more processors is further configured to apply an interpolation onto the generated k-space datasets, in order to generate a 3D Cartesian k-space dataset, and the at least one processor of the one or more processors is also configured to apply with the one or more processors a Fourier transform to each generated 3D Cartesian k-space dataset, that is generated order to generate the plurality of perfusion images.

13. The non-transitory computer readable storage medium of claim 8, wherein the instructions further command the one or more processors to acquire a tag image and a control image that are of an arterial blood flow interest is an arterial blood flow region, and the plurality of perfusion images include a plurality of inflow perfusion images or inflow angiography images, wherein the instructions command the processor to acquire that the tag image and the control image are of an arterial blood flow.

14. The non-transitory computer readable storage medium of claim 8, wherein the ASL pulse sequence generated by the RF coil includes a continuous ASL (CASL), a pulsed ASL (pASL), a pseudo continuous ASL with deteriorating (pCASL), or an amplitude modulated ASL (amCASL).

15. A Magnetic Resonance Imaging (MRI) system that generates a plurality of perfusion images, of a region of interest from k-space datasets that are generated from the application of an arterial spin labeling (ASL) pulse sequence and the application of a three-dimensional (3D) radial pulse sequence comprising:
a magnet having a plurality magnetic gradient coils, wherein the magnet is a superconducting magnet, a permanent magnet, or an electromagnet;
a radio frequency (RF) coil configured to provide transmission/reception of excitation pulse sequences;
a display; and
one or more processors configured to:
activate the RF coil in order to apply a labeling phase of an arterial spin labeling (ASL) pulse sequence to a region of interest;
generate a tag image of the region of interest by applying a three-dimensional (3D) radial pulse sequence with the activated RF coil onto the region of interest;
activate the RF coil in order to apply a control phase of the ASL pulse sequence onto the region of interest, wherein the applied control phase modifies a frequency, a phase, or an amplitude of the ASL pulse sequence; and
generate a control image of the region of interest by applying the 3D radial pulse sequence onto the region of interest with from the activated RF coil; and
subtract the generated control image from the generated tag image and thereby generate k-space datasets which are then utilized in generating a plurality of perfusion images based on the generated k-space datasets that are shown on the display.

16. The MRI system of claim 15, wherein the 3D radial pulse sequence that is applied is configured to encode free-inductance decay responses along different angular orientations in k-spaces, such that the 3D radial pulse sequence acquires k-space data spiraling radially outward at a top portion of the region of interest and then spiraling radially inward until the radially inner bottom portion of the region of interest is acquired.

17. The MRI system of claim 15, wherein the 3D radial pulse sequence includes a plurality of segments, and wherein the tag image and the control image are generated from the plurality of segments of the 3D radial pulse sequence.

18. The MRI system of claim, 17, wherein the subtracting operation includes subtracting the control image from the tag image, for each segment within the plurality of segments, in order to generate the k-space datasets for each segment.

19. The MRI system of claim 15, wherein at least one of the one or more processors is further configured to apply an interpolation onto the generated k-space datasets, in order to generate a 3D Cartesian k-space dataset, and the at least one processor of the one or more processors is also configured to apply with the one or more processors a Fourier transform to each generated 3D Cartesian k-space dataset, that is generated order to generate the plurality of perfusion images.

20. The MRI system of claim 15, wherein the ASL pulse sequence generated by the RF coil includes a continuous ASL (CASL), a pulsed ASL (pASL), a pseudo continuous ASL with deteriorating (pCASL), or an amplitude modulated ASL (amCASL).

* * * * *